(12) United States Patent
Fujii

(10) Patent No.: US 8,072,069 B2
(45) Date of Patent: Dec. 6, 2011

(54) SEMICONDUCTOR DEVICE AND METHOD OF MANUFACTURING A SEMICONDUCTOR DEVICE

(75) Inventor: Seiya Fujii, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 274 days.

(21) Appl. No.: 12/470,809

(22) Filed: May 22, 2009

(65) Prior Publication Data

US 2009/0289361 A1    Nov. 26, 2009

(30) Foreign Application Priority Data

May 26, 2008 (JP) ................................ 2008-136644

(51) Int. Cl.
*H01L 23/498* (2006.01)
(52) U.S. Cl. .. 257/737; 257/778; 257/738; 257/E23.068
(58) Field of Classification Search .................. 257/737, 257/778, 786, E23.068, E21.499, 738; 438/107, 438/108
See application file for complete search history.

(56) References Cited

U.S. PATENT DOCUMENTS

| | | | | |
|---|---|---|---|---|
| 5,444,303 A | * | 8/1995 | Greenwood et al. | ......... 257/786 |
| 6,747,331 B2 | * | 6/2004 | Infantolino et al. | ......... 257/457 |
| 7,064,451 B2 | * | 6/2006 | Satomi et al. | ................ 257/787 |
| 7,714,427 B2 | * | 5/2010 | Wong et al. | .................... 257/693 |
| 2004/0080034 A1 | | 4/2004 | Satomi et al. | |
| 2007/0057381 A1 | * | 3/2007 | Wong et al. | .................... 257/778 |

FOREIGN PATENT DOCUMENTS

| | | |
|---|---|---|
| JP | 58-216494 | 12/1983 |
| JP | 09-162531 | 6/1997 |
| JP | 2001-210749 | 8/2001 |
| JP | 2004-140079 | 5/2004 |
| JP | 2006-073625 | 3/2006 |
| JP | 2007-095964 | 4/2007 |

* cited by examiner

*Primary Examiner* — Roy Potter
(74) *Attorney, Agent, or Firm* — Young & Thompson

(57) ABSTRACT

A semiconductor device includes at least a wiring board, a semiconductor chip that is mounted on one face side of the wiring board, connection pads that are formed on the one face side of the wiring board, and connect through bonding wires to electrode pads on the semiconductor chip, and bumps disposed on another face side of the wiring board; the semiconductor chip is disposed such that four chip sides face corners of the wiring board, and each chip corner is near one of the outer peripheral sides of the wiring board; and, on one face of the wiring board are provided corner regions which are enclosed by the chip sides of the semiconductor chip and the corners of the wiring board, and the connection pads are disposed in these corner regions.

20 Claims, 10 Drawing Sheets

SEMICONDUCTOR DEVICE AND METHOD OF MANUFACTURING A SEMICONDUCTOR DEVICE

BACKGROUND OF THE INVENTION

1. Field of the Invention

The present invention relates to a BGA semiconductor device and a manufacturing method thereof.

Priority is claimed on Japanese Patent Application No. 2008-136644, filed May 26, 2008, the content of which is incorporated herein by reference.

2. Description of Related Art

FIG. 13 is a schematic bottom view of a related ball grid array (BGA) semiconductor device.

As shown in FIG. 13, a related ball grid array (BGA) semiconductor device 101 includes a semiconductor chip 106 mounted on a wiring board 102, the semiconductor chip 106 usually being mounted such that each of its corners faces a corner of the wiring board 102. In other words, four sides of the semiconductor chip 106, which is substantially rectangular in plane view, are roughly parallel to the four sides of the wiring board 102, which is also substantially rectangular in plane view. The arrangement is such that, among a plurality of connection bumps 105 mounted in a matrix formation on the wiring board 102, connection bumps 105a at the corners are close to corners 102a of the wiring board 102. Thus, corners 106a of the semiconductor chip 106 roughly match the positions of the corner-portion connection bumps 105a among the plurality of connection bumps 105.

With such a structure, in packaging temperature cycle (TC) testing, stress generated by the difference in the linear expansion coefficients ($\alpha$) of the wiring board 102 and the semiconductor chip 106, and by the difference in the linear expansion coefficients ($\alpha$) of the semiconductor device 101 and a mount board, resulted in breakage of the connection bumps 105 made from solder balls and the like. The main reason for this is that connection bumps arranged close to the corners of the wiring board 102, and connection bumps arranged directly below the corners of the semiconductor chip 106, receive considerable stress. The reliability of the semiconductor device 101 deteriorates markedly as a result.

One countermeasure for preventing such connection bump breakage that has already been proposed is to increase the connection strength of the connection bumps by making only the connection bumps at the corners larger (Japanese Unexamined Patent Application, First Publication, No. 2001-210749). Another technique arranges the connection bumps concentrically around a center of the wiring board, thereby preventing damage caused by stress concentrating at a specific connection bump (Japanese Unexamined Patent Application, First Publication, No. Hei 09-162531).

While these techniques are effective against breakage of corner connection bumps among a plurality of connection bumps arranged in a matrix, they are not very practical. One reason is that, when the size and arrangement of the bumps are changed, the design of the wiring-board-side lands and the like must also be changed. Recently, the electronics industry is becoming increasingly specialized, and manufacturers of semiconductors and the like are choosing a single-business strategy, with a resultant trend towards fewer manufacturers who are jointly developing semiconductor chips and wiring boards. Name-brand manufacturers who do not have a semiconductor chip manufacturing section need to procure more versatile semiconductor chips from a plurality of semiconductor manufacturers, and, in regard to matters such as bump alignment, must standardize these with other companies wherever possible.

While the objective is different, techniques for tilting a semiconductor chip with respect to the wiring board, for example, are disclosed in Japanese Unexamined Patent Application, First Publications, No. 2006-73625, No. 2007-95964, and No. 2004-140079. However, when simply tilting the semiconductor chip with respect to the wiring board as in these related techniques, the size of the wiring board must be increased such that the semiconductor chip does not extrude from the wiring board due to the diagonal line being longer than one side of the semiconductor chip. When the size of the wiring board increases, the semiconductor device becomes bigger, and, when cutting the wiring board from a mother material of the wiring board, the number of products that can be taken from one wiring board mother material decreases, leading to a danger of higher cost.

When the size of the wiring board increases further, so does the amount of sealing resin for sealing the semiconductor chip on the wiring board, leading to an increase in stress arising from the difference between the linear expansion coefficients of the wiring board and the sealing resin, and a greater danger that the semiconductor device will be warped.

Further, in related techniques, there is a danger that the connection bumps will be disposed directly below the corners of a semiconductor chip that is tilted with respect to the wiring board, making the reliability of secondary mounting problematic. It is therefore impossible to realize a reliable and miniaturized semiconductor device.

SUMMARY

The present invention seeks to solve one or more of the above problems, or to improve upon those problems at least in part.

In one embodiment, there is provided a semiconductor device that includes at least: a wiring board that has four sides joined by four corners; and a semiconductor chip that has four chip sides joined by four chip corners, and is disposed on one face side of the wiring board, wherein the semiconductor chip is disposed such that its four chip sides face the corners of the wiring board, and each chip corner of the semiconductor chip is near a respective one of the sides of the wiring board, and on one face of the wiring board, the wiring board has each corner region being defined by the chip sides that face the each corner and the wiring board sides that form the same corner, and the connection pads are disposed in the corner regions.

In another embodiment, there is provided a semiconductor device that includes at least: a wiring board that is rectangular in plane view and has four sides joined by four corners; a semiconductor chip that is rectangular in plane view and has four chip sides joined by four chip corners, and is disposed on one face side of the wiring board; connection pads that are formed on the one face side of the wiring board, and are connected via bonding wires to electrode pads of the semiconductor chip; a plurality of bumps arranged in a matrix on another face side of the wiring board; and internal wirings that are formed on the wiring board, the internal wirings connecting the bumps to the connection pads, wherein the semiconductor chip is disposed such that its four chip sides face the corners of the wiring board, and each chip corner of the semiconductor chip is near a respective one of the sides of the wiring board, and on one face of the wiring board, the wiring board has each corner region being defined by the chip sides that face the each corner and the wiring board sides that form the same corner, and the connection pads are disposed in the corner regions.

In another embodiment, there is provided a method of manufacturing a semiconductor device that includes at least: preparing a wiring board that has four sides joined by four corners and has connection pads being disposed on one face of the board near the corners, wherein the wiring board has a plurality of lands in a matrix-shape disposed on another face of the wiring board electrically connected to the connection pads; mounting, on the wiring board, a semiconductor chip that has four chip sides joined by four corners on one face of the wiring board, such that the four chip sides face corners of the wiring board and the chip corners are near the sides of the wiring board; connecting electrode pads of the semiconductor chip and connection pads of the wiring board by bonding wires; disposing a plurality of bumps on the lands in a matrix-shape on another face of the wiring board; and connecting the bumps to the connection pads.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
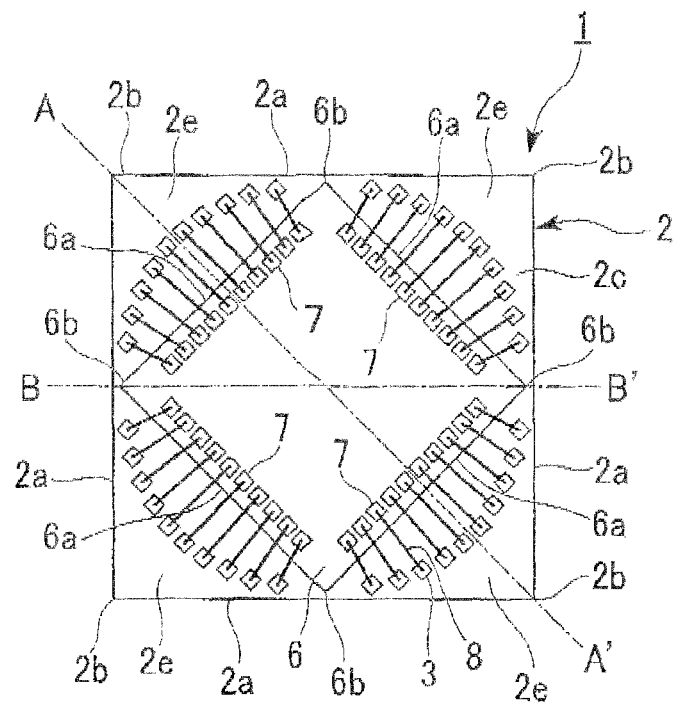
FIG. 1 is a schematic plane view showing one example of a semiconductor device in a first embodiment of the invention.
Figure 2:
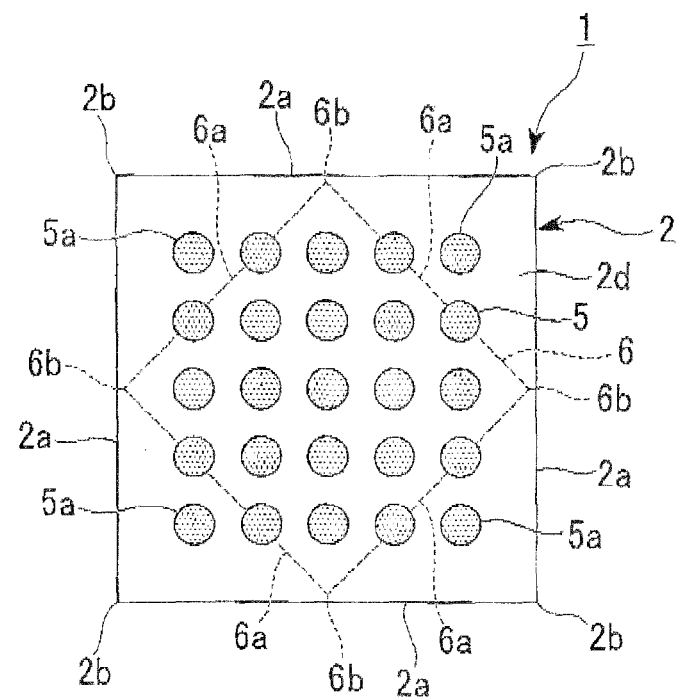
FIG. 2 is a schematic bottom view showing one example of a semiconductor device in a first embodiment of the invention.
Figure 3:
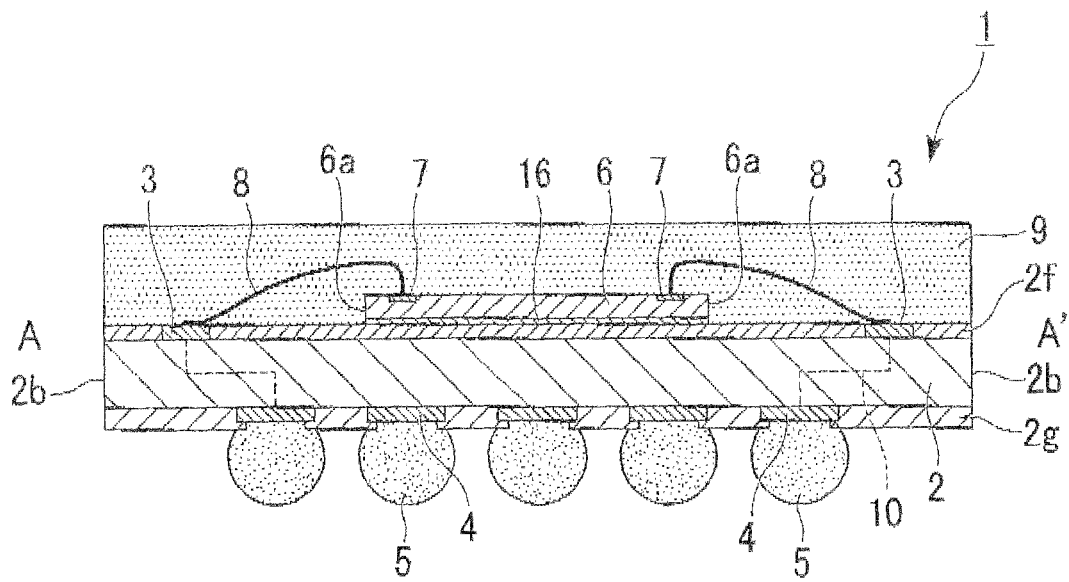
FIG. 3 is a schematic cross-sectional view corresponding to the line A-A' of FIG. 1.
Figure 4:
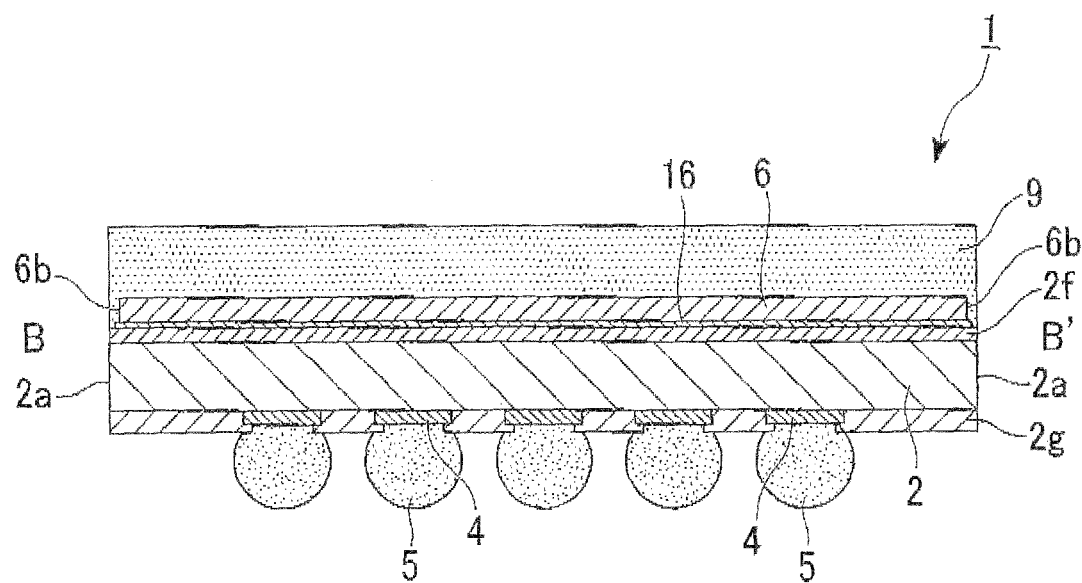
FIG. 4 is a schematic cross-sectional view corresponding to the line B-B' of FIG. 1.

Embodiments of the invention will be explained with reference to the drawings. FIG. 1 is a schematic plane view of one example of a semiconductor device in a first embodiment of the invention, FIG. 2 is a schematic bottom view of one example of a semiconductor device in a first embodiment of the invention, FIG. 3 is a schematic cross-sectional view corresponding to the line A-A' of FIG. 1, and FIG. 4 is a schematic cross-sectional view corresponding to the line B-B' of FIG. 1.

A semiconductor device 1 shown in FIGS. 1 to 4 includes at least a wiring board 2 that is rectangular in plane view and has four outer peripheral sides 2a joined by four corners 2b, a semiconductor chip 6 that is rectangular in plane view and has four chip sides 6a joined by four chip corners 6b, and is mounted on one face 2c side of the wiring board 2, connection pads 3 that are formed on the one face 2c side of the wiring board 2 and are connected via bonding wires 8 to electrode pads 7 of the semiconductor chip 6, a plurality of bumps 5 arranged in a matrix on another face 2d side of the wiring board 2, and internal wirings 10 that are formed on the wiring board for connecting the bumps 5 to the connection pad 3.

On one face of the semiconductor chip 6 are fabricated, for example, logical circuits, storage circuits, and the like. On one face of the semiconductor chip 6 near the chip sides 6a, a plurality of electrode pads 7 are arranged in rows along the chip sides 6a.

A sealing resin is laminated over the one face 2c of the wiring board 2, and seals the semiconductor chip 6 and the bonding wires 8. The wiring board 2 is, for example, a glass epoxy board having a thickness of 0.25 mm, and includes internal wiring 10. A plurality of connection pads 3 are disposed in rows on the one face 2c of the wiring board 2. Also, a plurality of lands 4 are disposed on another face 2d of the wiring board 2. The connection pads 3 and the lands 4 corresponding to them are electrically connected by the internal wiring 10 of the wiring board. The plurality of connection pads 3 are arranged near the corners 2b of the wiring board 2. Resist layers 2f and 2g are laminated respectively on the one face 2c and the other face 2d of the wiring board 2.

Bumps 5 that become outer terminals are mounted on the plurality of lands 4, and are disposed in a matrix-shape at predetermined intervals as shown in FIG. 2.

Figure 13:
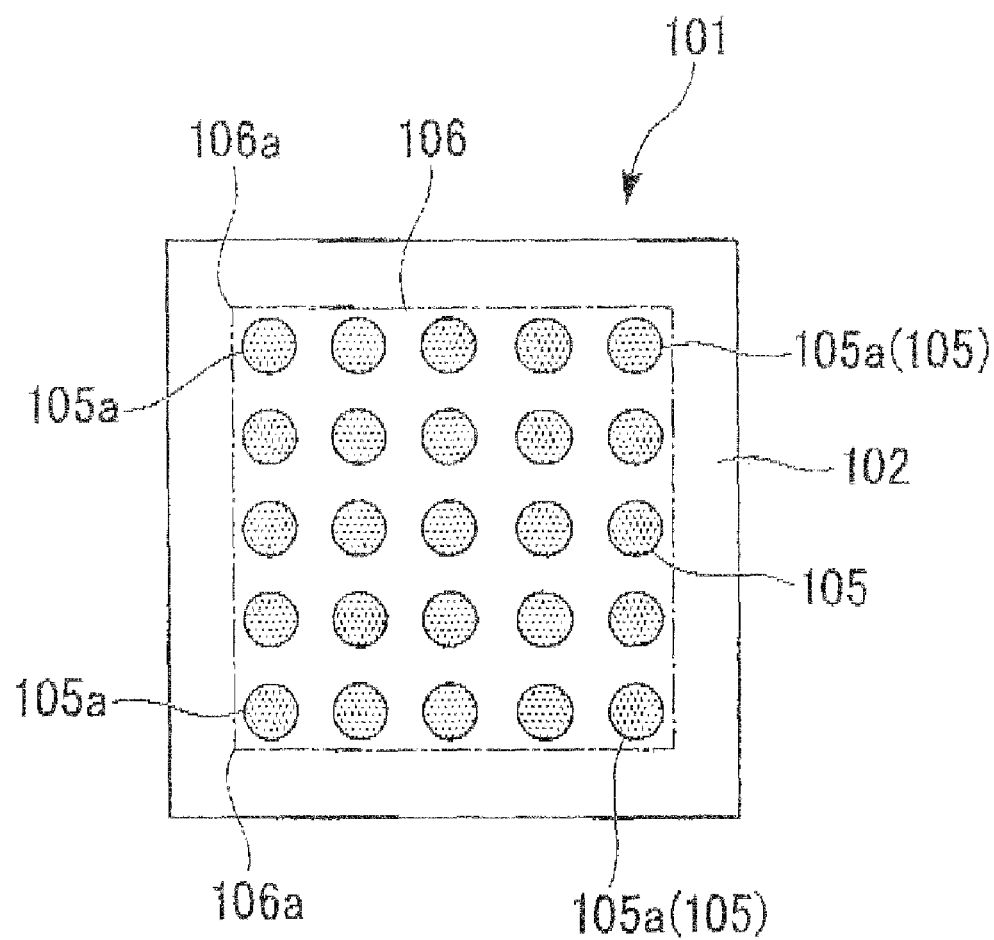
FIG. 13 is a schematic plane view showing a related semiconductor device.

The semiconductor chip 6 is secured to the one face 2c of the wiring board 2 through an insulating adhesive. The semiconductor chip 6 is mounted on the wiring board 2 such that the four chip sides 6a face toward the corners 2b of the wiring board 2, and each chip corner 6b is arranged near one of the outer peripheral sides 2a of the wiring board 2. In FIGS. 1 and 2, in comparison with the related product of FIG. 13, the wiring board 2 is mounted at a rotation of 45 degrees taking the center of the wiring board 2 as its axis. As shown in FIGS. 1 and 2, since the semiconductor chip 6 and the corners 2b of the wiring board 2 are thereby tilted by 45 degrees with respect to the extending directions of the outer peripheral sides 2a of the wiring board 2, the corners 6b of the semiconductor chip 6 do not overlap with the corner bumps among the bumps 5 arranged in a matrix on the other face 2d of the wiring board 2.

The chip corners 6b of the semiconductor chip 6 are arranged near each of the outer peripheral sides 2a of the wiring board 2. The chip corners 6b of the semiconductor chip 6 are arranged approximately 50 μm to 100 μm to the inside from the end of the sealing resin 9 of the semiconductor device. By arranging the chip corners 6b of the semiconductor chip 6 near the outer peripheral sides 2a of the wiring board 2 in this manner, the area that the semiconductor chip 6 occupies on the wiring board 2 is increased, and the semiconductor chip 6 can reinforce opposing peripheral sides of the wiring board 2, thereby reducing warping of the semiconductor device 1.

Moreover, the bumps 5 are not disposed immediately below the chip corners 6b of the semiconductor chip 6, so that positions immediately below the chip corners 6b of the semiconductor chip 6 where stress against the bumps 5 concentrates are near the outer peripheral sides 2a of the wiring board 2, whereby the reliability of secondary packaging can be enhanced.

Thus, by mounting the semiconductor chip 6 in a tilted state with respect to the wiring board 2, and disposing the chip corners 6b of the semiconductor chip 6 near the outer peripheral sides 2a of the wiring board 2, the length of the one outer peripheral side 2a of the wiring board 2 can be configured to be almost the same as the length of the diagonal line of the semiconductor chip 6, thereby achieving the smallest size possible when the semiconductor chip 6 is mounted in rotation on the wiring board 2.

On one face 2c of the wiring board 2 there are provided corner regions 2e, which are enclosed by the chip sides 6a of the semiconductor chip 6 and the corners 2b of the wiring board 2, with the connection pads 3 being disposed in the corner regions 2e. The plurality of connection pads 3 in the corner regions 2e are arranged in rows that in plane view curve in an arc-shape facing toward the corner 2b sides of the wiring board 2. A plurality of bonding wires 8 for joining the electrode pads 7 and the connection pads 3 are wired such as to spread mutually in a fan-shape from the electrode pads 7 toward the connection pads 3. The semiconductor chip 6, the corner regions 2e, and the bonding wires 8 are then sealed with the sealing resin 9. The sealing resin 9 is a thermosetting resin such as, for example, epoxy resin. The bonding wires 8 are made from, for example, Au, Cu, Al, etc.

This type of wiring board 2 allows the use of bonding wires that spread in a fan-shape from the electrode pads 7 of the semiconductor chip 6 to the connection pads 3 of the wiring board 2, whereby the wiring interconnections can be formed more compactly.

Bumps 5 such as solder balls are mounted on the other face 2d of the wiring board 2, forming outer terminals. Preferably, the bumps 5 are arranged such that the corners 2b of the wiring board 2 and the corners of the matrix-shape of the bumps 5 face in the same direction.

Thus the semiconductor chip 6 can be mounted on the wiring board 2 with the chip corners 6b of the semiconductor chip 6 and the corner bumps 5a among the bumps 5 arranged in a matrix in different directions, with the corners 2b of the wiring board 2 and the bumps 5a facing in the same direction, and while ensuring that the chip corners 6b of the semiconductor chip 6 do not overlap with the corners of the bumps 5 arranged in a matrix on the wiring board 2. Further, since positions immediately below the chip corners 6b of the semiconductor chip 6 where stress against the bumps 5 is generated are disposed at the outer peripheral sides 2a of the wiring board 2, it can be ensured that the bumps 5 are not immediately below the chip corners 6b of the semiconductor chip 6.

This makes it possible to avoid a problem whereby stress generated by a difference between the linear expansion coefficients α of the wiring board 2 and the semiconductor chip 6 in packaging TC testing and such like concentrates at the bumps 5a that are disposed at the four corners among the plurality of bumps, resulting in early open failure. That is, since the bumps 5 are no longer disposed below the chip corners 6b of the semiconductor chip 6, the service life of the bumps 5 can be increased. Therefore, the reliability of the secondary packaging of the semiconductor device 1 can be increased without modifying the arrangement of the bumps 5.

Since the area that the semiconductor chip 6 occupies on the wiring board 2 increases, and the semiconductor chip 6 can reinforce the opposing peripheral sides of the wiring board 2, warping of the semiconductor device 1 can be reduced.

By arranging the chip corners 6b of the semiconductor chip 6 mounted at a tilt of 45 degrees near the outer peripheral sides 2a of the wiring board 2, and arranging the connection pads 3 at the corners 2b of the wiring board 2, the size of the semiconductor device 1 can be reduced. That is, when the semiconductor chip 6 is mounted without tilting it, the probability of edge short circuit increases, whereby it becomes difficult to tension the bonding wires 8 toward the corners of the wiring board 2, and connection pads are not provided in regions near the corners 2b of the wiring board 2. In this embodiment, since the chip sides 6a of the semiconductor chip 6 face the direction of the chip corners 6b of the semiconductor chip 6, the bonding wires 8 can easily be tensioned toward the direction of the corners 2b of the wiring board 2.

As a result, the corner regions 2e of the wiring board 2 can be used effectively, and, in comparison with when mounting the semiconductor chip 6 at the same size as the wiring board 2 and without tilting it, a wide region for laying the wiring can be ensured. Furthermore, since the connection pads 3 are disposed in an arc-shape facing toward each corner 2b of the wiring board 2, the wiring interconnections can be formed more compactly from the electrode pads 7 of the semiconductor chip 6. That is, the wiring board 2 can be made as small as possible while utilizing the wire-laying region on the wiring board 2 to maximum effect, and can also be applied in the high-density multi-wire semiconductor device 1. As will be explained in another example of a semiconductor device, disposing the connection pads 3 in a plurality of curving rows on the wiring board 2 makes it applicable for higher-density wire arrangement using long and short wire.

Subsequently, a semiconductor device manufacturing method will be explained with reference to FIGS. 5 to 10.

Figure 5A:
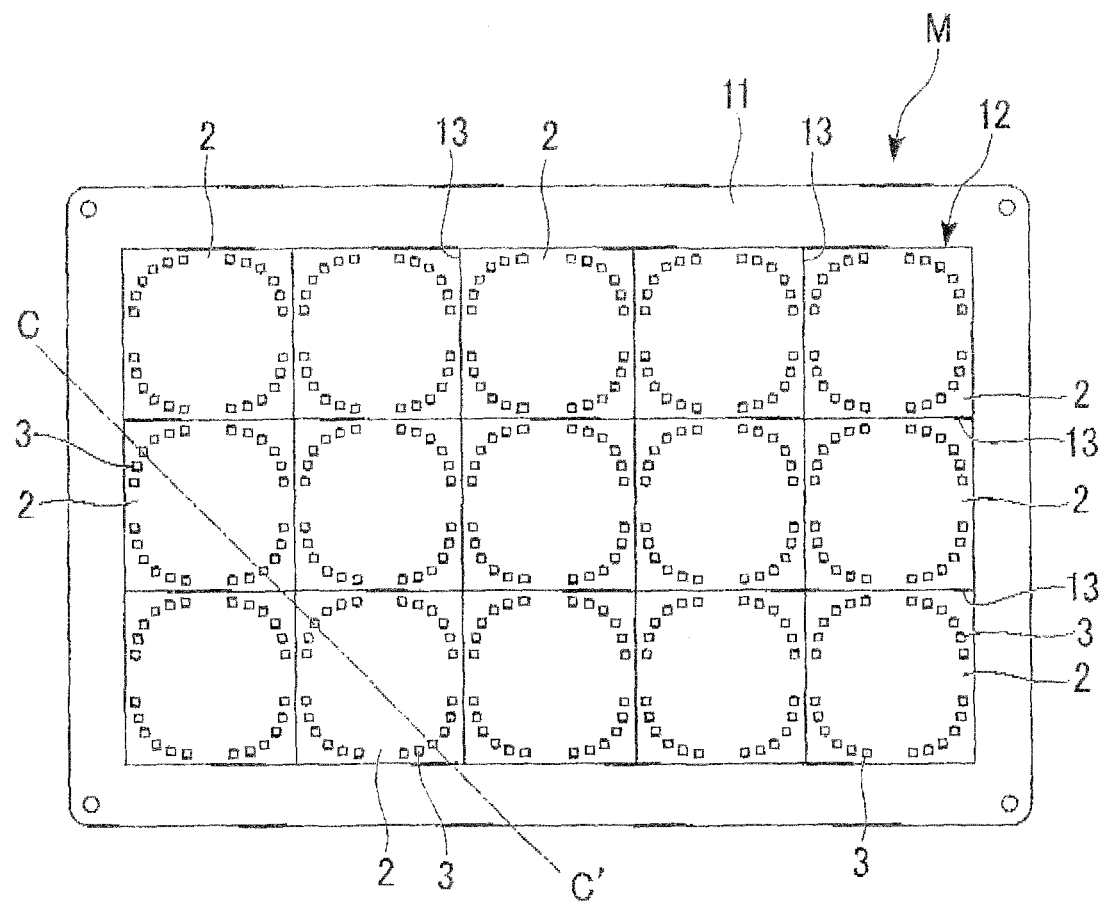
FIGS. 5A and 5B are flowcharts showing a method of manufacturing a semiconductor device in a first embodiment of the invention, FIG. 5A being a schematic plane view showing a wiring motherboard, and FIG. 5B, a schematic cross-sectional view corresponding to line C-C' of FIG. 5A.
Figure 5B:
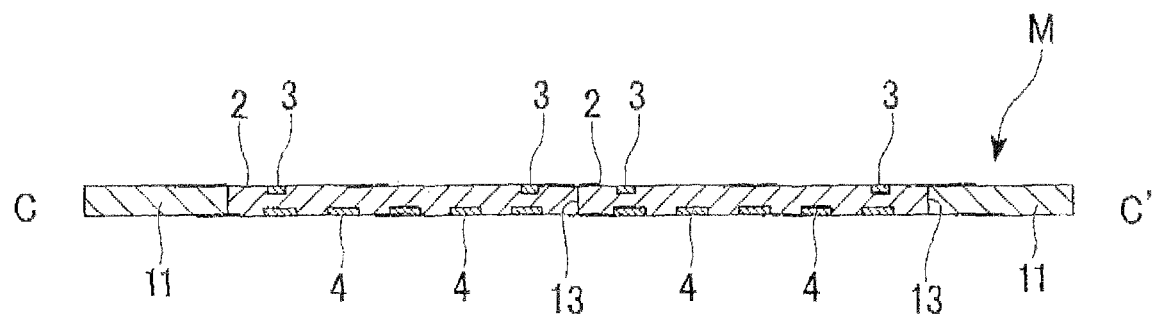
Figure 6A:
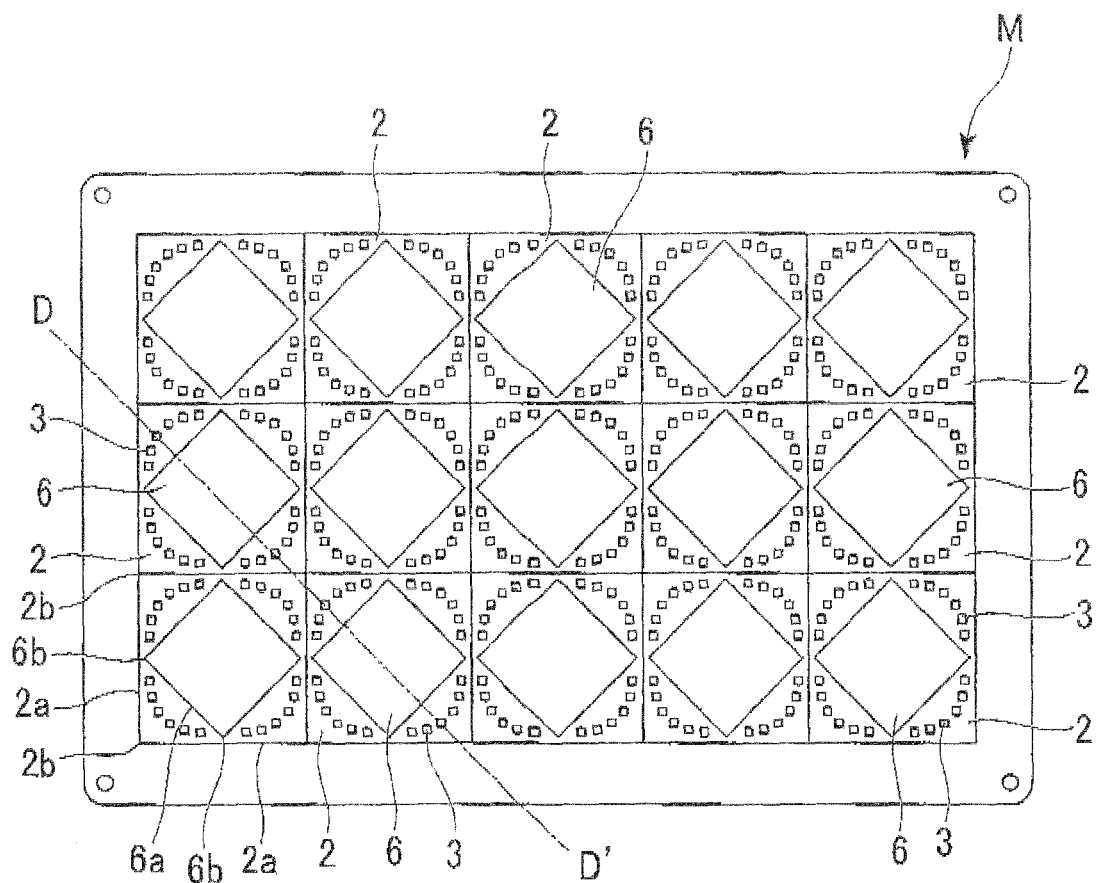
FIGS. 6A and 6B are diagrams showing a mounting step in a method of manufacturing a semiconductor device in a first embodiment of the invention, FIG. 6A being a schematic plane view showing a wiring motherboard, and FIG. 6B, a schematic cross-sectional view corresponding to line D-D' of FIG. 6A.
Figure 6B:
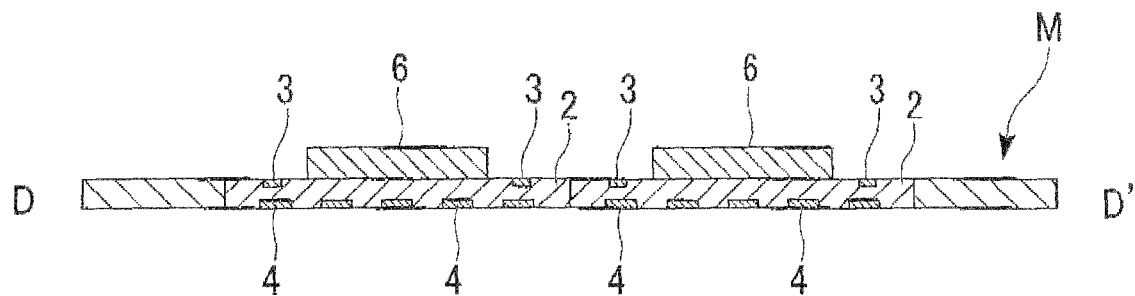
Figure 7A:
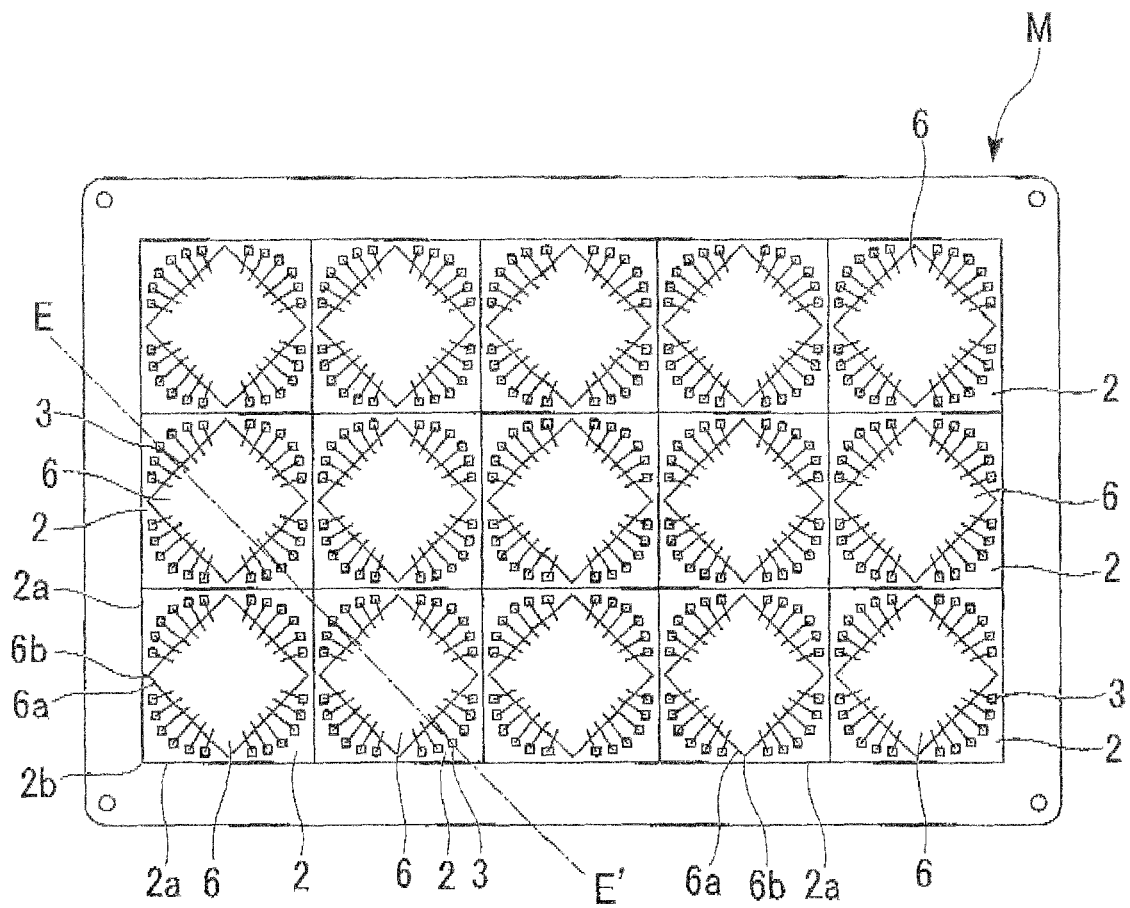
FIGS. 7A and 7B are diagrams showing a connecting step in a method of manufacturing a semiconductor device in a first embodiment of the invention, FIG. 7A being a schematic plane view showing a wiring motherboard, and FIG. 7B, a schematic cross-sectional view corresponding to line E-E' of FIG. 7A.
Figure 7B:
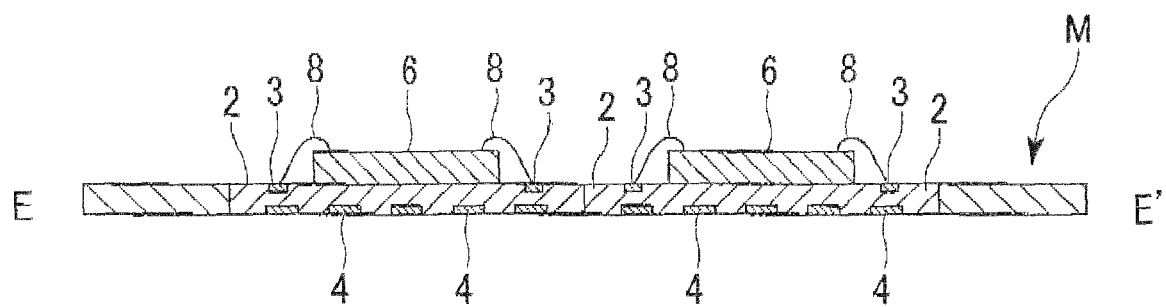
Figure 8A:
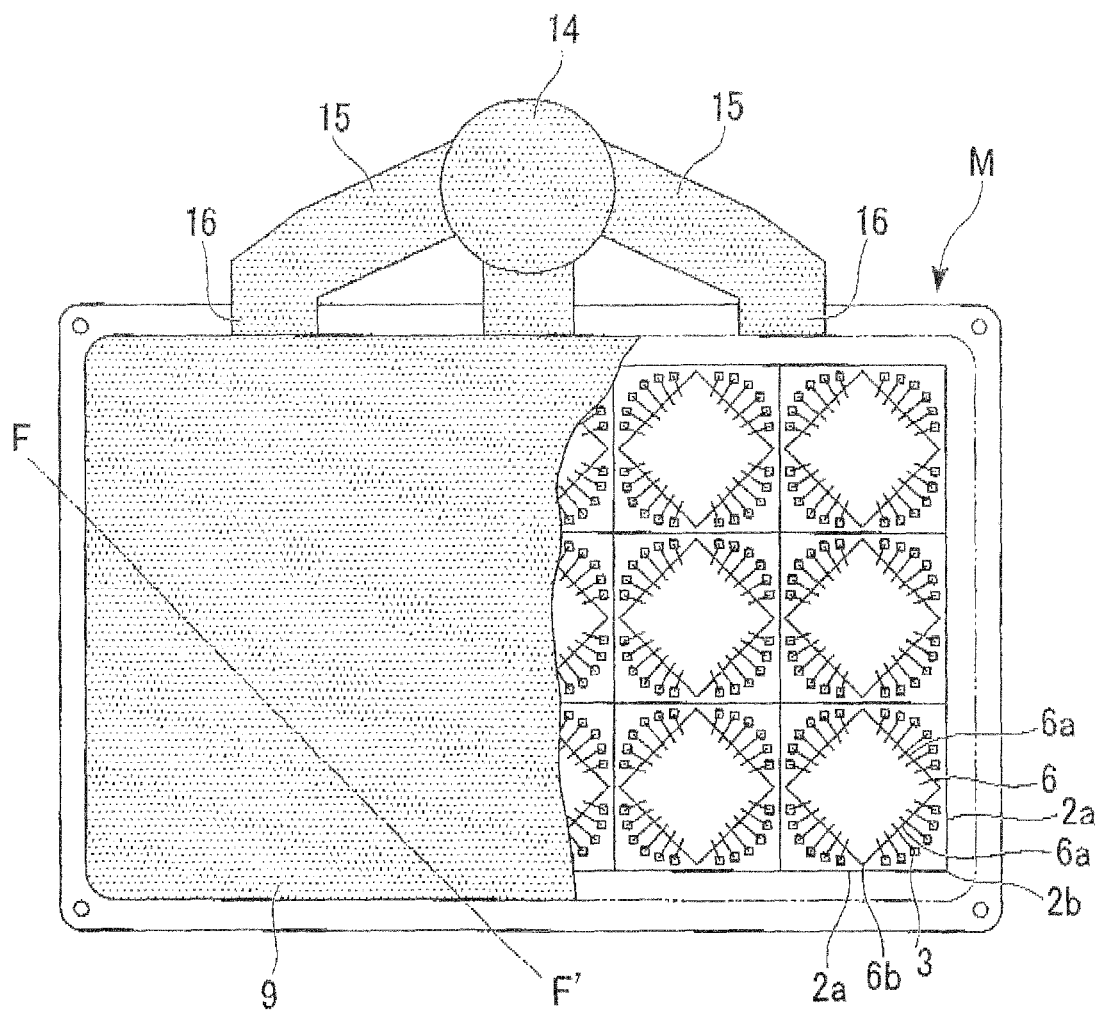
FIGS. 8A and 8B are diagrams showing a sealing resin-laminating step in a method of manufacturing a semiconductor device in a first embodiment of the invention, FIG. 8A being a schematic plane view showing a wiring motherboard, and FIG. 8B, a schematic cross-sectional view corresponding to line F-F' of FIG. 8A.
Figure 8B:
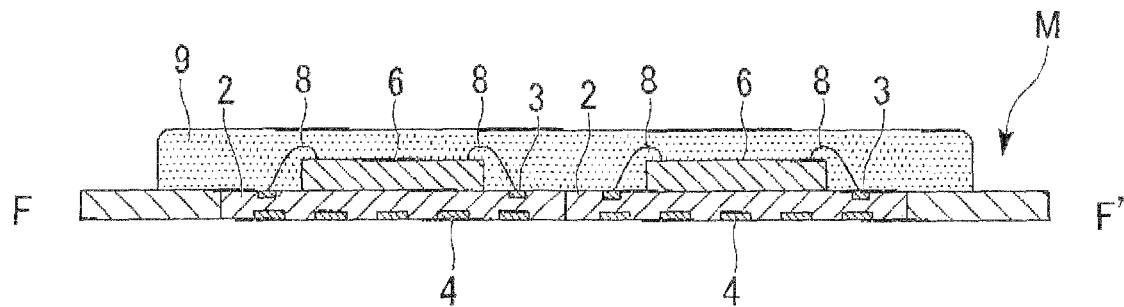
Figure 9A:
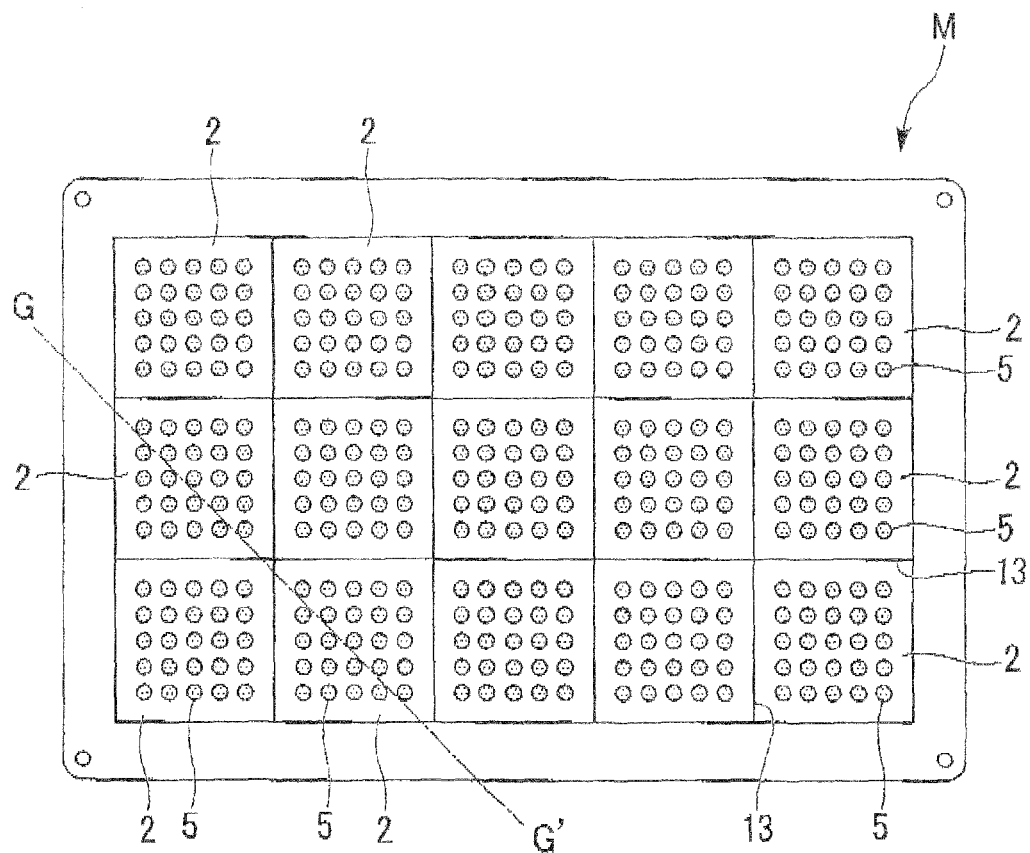
FIGS. 9A and 9B are diagrams showing a bump-forming step in a method of manufacturing a semiconductor device in a first embodiment of the invention, FIG. 9A being a schematic plane view of a wiring motherboard, and FIG. 9B, a schematic cross-sectional view corresponding to line G-G' of FIG. 9A.
Figure 9B:
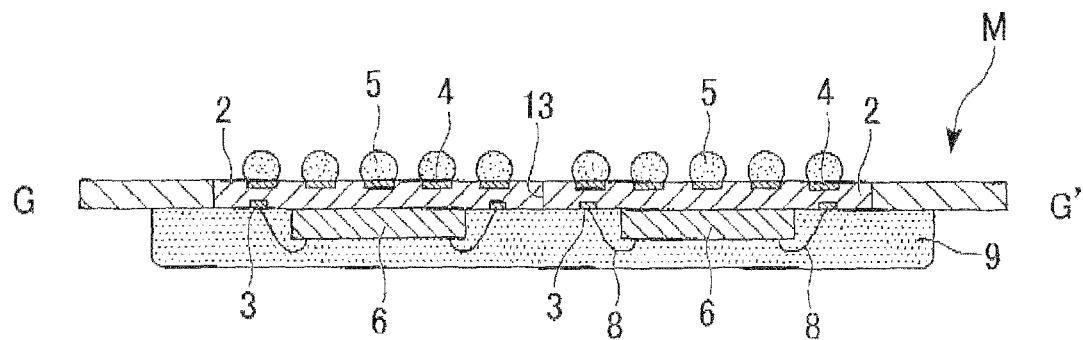
Figure 10A:
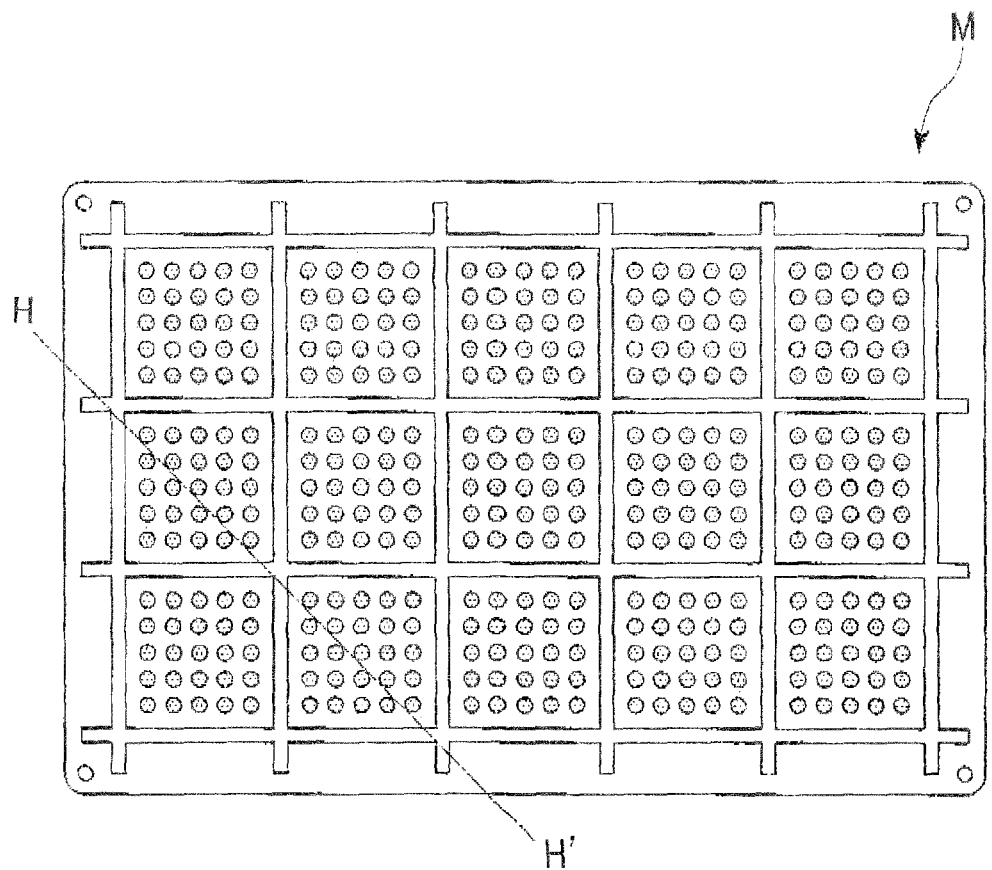
FIGS. 10A and 10B are diagrams showing a dividing step in a method of manufacturing a semiconductor device in a first embodiment of the invention, FIG. 10A being a schematic plane view of a wiring motherboard, and FIG. 10B, a schematic cross-sectional view corresponding to line H-H' of FIG. 10A.
Figure 10B:
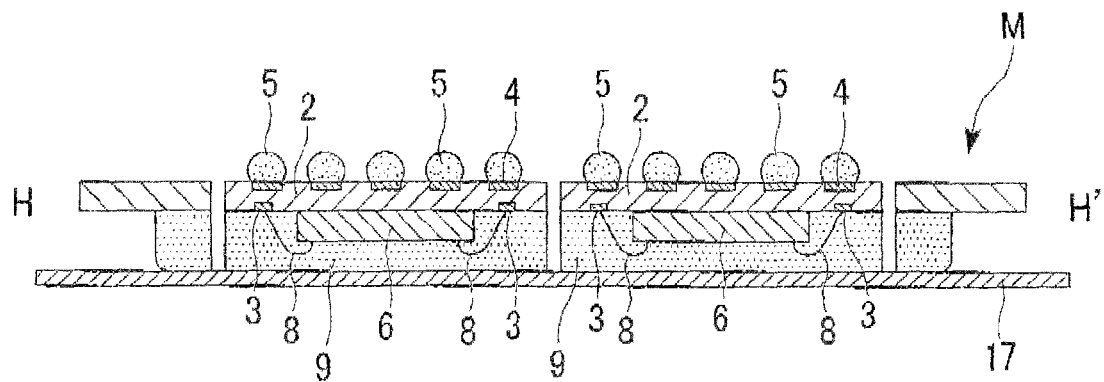

FIG. 5 is a flowchart of a method of manufacturing a semiconductor device, FIG. 6 is a diagram of mounting step, FIG. 7 is a diagram of a connecting step, FIG. 8 is a diagram of a sealing resin-laminating step, FIG. 9 is a diagram of a bump-forming step, and FIG. 10 is a diagram of a division step. In FIGS. 5A to 10A and FIGS. 5B to 10B, FIGS. 5A to 10A are schematic plane views showing a wiring motherboard, while FIGS. 5B to 10B are schematic cross-sectional views corresponding respectively to lines C-C' to H-H' of FIGS. 5A to 10A.

A method of manufacturing the semiconductor device 1 according to this embodiment roughly includes a mounting step of preparing a wiring board 2 that is rectangle-shaped in plane view, and mounting a semiconductor chip 6 that is rectangular in plane view on one face 2*c* of the wiring board 2, such that four chip sides 6*a* face corners 2*b* of the wiring board 2 and the chip corners 6*b* are near the outer peripheral sides 2*a* of the wiring board 2, a connecting step of connecting electrode pads 7 of the semiconductor chip 6 to connection pads 3 of the wiring board 2 by bonding wires 8, and a bump-forming step of disposing a plurality of bumps 5 in a matrix-shape on another face 2*d* of the wiring board 2, and connecting the bumps 5 to the connection pads 3 through internal wiring 10 formed in the wiring board 2. These steps will be explained one by one.

Firstly, a wiring board 2 used in manufacturing the semiconductor device 1 is made from a glass epoxy base material. As shown in FIG. 5, a plurality of wiring boards 2 are disposed in a matrix-shape within a frame 11 and integrated to form a product-formation region 12. In the product-formation region 12, the wiring boards 2 are disposed in a matrix-shape with dicing lines formed between them. The wiring board 2 of the semiconductor device 1 is obtained by cutting along the dicing lines.

The wiring board 2 in the product-formation region 12 has a structure similar to that of the wiring board 2 described above, with a plurality of connection pads 3 disposed in an arc-shape at each corner 2*b* of the wiring board 2. A plurality of lands 4 are disposed in a matrix-shape on the other face 2*d*. The connection pads 3 and their corresponding lands 4 are then electrically connected through internal wiring and the like. This completes the wiring board 2. Hereinafter, a board including the frame 10 and the plurality of product-formation regions 12 is termed 'wiring motherboard M'.

The wiring motherboard M including the wiring boards 2 is then transferred to a die-bonding step (mounting step), and, as shown in FIG. 6, a semiconductor chip 6 is mounted on each wiring board 2. In the die-bonding step, a die-bonding apparatus (not shown) secures the semiconductor chip 6 to each wiring board 2 through, for example, an insulating adhesive. The semiconductor chip 6 is mounted on the wiring board 2 at a 45-degree tilt such that its four chip sides 6*a* face the corners 2*b* of the wiring board 2, and the chip corners 6*b* are near the outer peripheral sides 2*a* of the wiring board 2.

The chip corners 6*b* of the semiconductor chip 6 mounted at a 45-degree tilt are disposed near the outer peripheral sides 2*a* of the wiring board 2 at, for example, approximately 50 μm to 100 μm from the dicing lines 13. Disposing the chip corners 6*b* at a slight distance from the outer peripheral sides 2*a* of the wiring board 2 in this manner avoids contact between semiconductor chips 6 on adjacent wiring boards 2 prior to dividing, and enables the semiconductor chips 6 to be better mounted.

Subsequently, the wiring motherboard M is transferred to a wire-bonding step (connecting step), in which, as shown in FIG. 7, electrode pads 7 on the semiconductor chip 6 and corresponding connection pads 3 on the wiring board 2 are connected by conductive bonding wires 8 made from, for example, Au or the like. In performing wire-bonding, a wire-bonding apparatus (not shown) thermosonically bonds the bonding wires 8, which are melted and have balls formed at their front ends, to the electrode pads 7, and then connects their rear ends onto the connection pads 3 of the wiring board 2 by thermosonic bonding while drawing them in a predetermined loop-shape. The predetermined electrode pads 7 and the predetermined connection pads 3 are connected by the bonding wires 8.

This embodiment uses a wiring board 2 including a plurality of connection pads 3 that are disposed in rows along mount positions for the chip sides 6*a* of the semiconductor chip 6 while curving to the corner 2*b* sides of the wiring board 2, and uses a semiconductor chip 6 including a plurality of connection pads 3 disposed along the chip sides 6*a* on one face of the semiconductor chip 6. When using the bonding wires 8 to connect the electrode pads 7 to the connection pads 3, the bonding wires 8 are disposed such that they spread in a fan-shape from the electrode pads 7 towards the connection pads 3.

This enables the wiring interconnections to be laid at higher density within a smaller space, and can increase the processing efficiency of the wire-bonding step.

The wiring motherboard M of wiring boards that have completed the wire-bonding step is then transferred to a molding step (sealing step). In the molding step, the wiring motherboard M is clamped between a top die and a bottom die of a transfer-mold apparatus (not shown) and, in that state, filled with molten sealing resin such as, for example, thermosetting epoxy resin or the like; it is cured in this filled state, thereby hardening the sealing resin, and, as shown in FIG. 8, forming a seal 9 that covers the plurality of wiring boards 2 in blanket fashion. The molten resin is injected over the wiring boards 2 from a cull 14 via runners 15 and gates 16.

Thus, since the semiconductor chip 6 is mounted at a tilt to the wiring board 2, and the bonding wires 8 are formed facing the corners 2*b* of the wiring board 2, this can reduce the bonding wires 8 that are disposed perpendicular to the flow direction of the sealing resin, and can thereby reduce wire flow. Furthermore, since the connection pads 3 are disposed in an arc-shape, the wires 8 can be formed at roughly equal intervals, enhancing the fluidity of the sealing resin. Moreover, since a blanket mold is used, the sealing resin 9 can be formed efficiently.

Subsequently, the wiring motherboard M is transferred to a ball-mounting step (bump-forming step). As shown in FIG. 9, in the ball-mounting step, outer terminals are formed by mounting bumps 5 made from solder balls on top of lands 4 on another face of the wiring motherboard M. For example, a mount tool of a ball-mounter (not shown) is used in vacuum-sucking the solder balls, which are then mounted onto the lands 4 on the wiring motherboard M with a flux in between. The wiring motherboard M is then reflowed, whereby the solder balls are connected onto the lands 4 and the bumps 5 are formed.

Subsequently, the wiring motherboard M with the bumps 5 mounted on it is shifted to a board-dicing step. As shown in FIG. 10, in the board-dicing step, the sealing resin 9 is pasted to a dicing tape 17, and a fast-rotating dicing blade (not shown) rotary-grinds the dicing lines 13 of the wiring motherboard M, cutting and separating it into individual wiring boards 2. Since the chip corners 6*b* of the semiconductor chip 6 are at a slight distance from the outer peripheral sides 2*a* of the wiring board 2, being approximately 50 μm to 100 μm from the dicing lines 13, dicing can be performed to a high standard without touching the semiconductor chip 6. Also, since the semiconductor chip 6 is not exposed from the sealing resin 9, moisture-resistance can be ensured.

After that, by being picked up from the dicing tape 17, the semiconductor device 1 shown in FIG. 1 is obtained.

Figure 11:
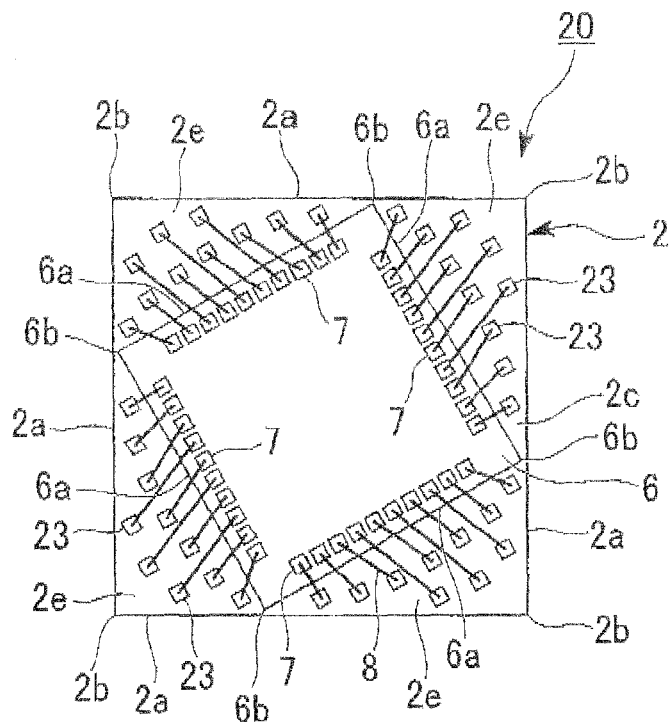
FIG. 11 is a schematic plane view showing another example of a semiconductor device in a first embodiment of the invention.
Figure 12:
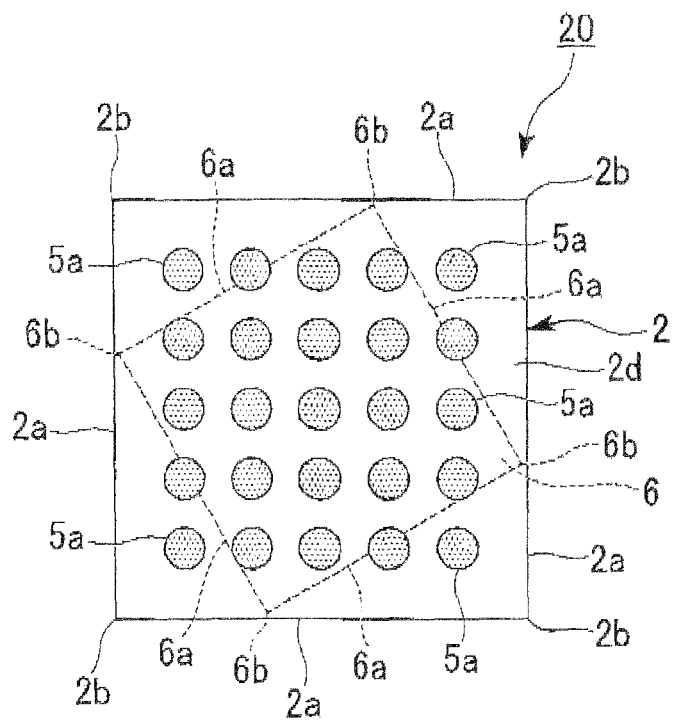
FIG. 12 is a schematic bottom view showing another example of a semiconductor device in a first embodiment of the invention.

FIG. 11 is a plane view of a schematic configuration of another example of a BGA semiconductor device of this embodiment. FIG. 12 is a plane view of the bottom-face configuration of the semiconductor device of FIG. 11.

A semiconductor device 20 shown in FIGS. 11 and 12 differs from the semiconductor device 1 shown in FIGS. 1 to 4 in that the disposition angle of the semiconductor chip 6 mounted on the wiring board 2 is different. The semiconductor chip 6 is mounted at a tilt within a range of 10 to 44 degrees. This enables the wiring board 2 to be made even smaller. This reduction in the size of the wiring board 2 enables the semiconductor device 20 to be made smaller, and thereby increases the number of products that can be manufactured from one wiring motherboard M, lowering the cost.

In the semiconductor device 20 shown in FIGS. 11 and 12, a plurality of electrode pads 7 are disposed in rows along the chip sides 6a on one face of the semiconductor chip 6, whereas a plurality of connection pads 23 in corner regions 2e are disposed in two lines along the chip sides 6a of the semiconductor chip 6 such that they curve to the corner 2b sides of the wiring board 2. The plurality of connection pads 23 may be disposed in three or more lines along the chip sides 6a. Thus, the area of the corner regions is compressed without actually making the wiring board 2 smaller, whereby wiring with the bonding wires 8 can be performed reliably.

Due to the 10 to 44 degree tilt of the semiconductor chip 6, the positions of the chip corners 6b of the semiconductor chip 6 are kept away from the areas between adjacent wiring boards, thereby reducing the risk of touching the chip when mounting it. Moreover, since the positions of the chip corners 6b of the semiconductor chip 6 are deviated among adjacent product-formation parts, the chip 6 gap between wiring boards 2 can be increased. This can enhance the fluidity of the sealing resin 9.

A method of manufacturing the semiconductor device 20 shown in FIGS. 11 and 12 can be performed by executing steps similar to those in the manufacturing method described earlier, with the exceptions that the wiring board 2 includes a plurality of connection pads 23 which are disposed such that they curve to the corner 2b sides of the wiring board 2 while being arranged in two lines along the chip sides 6a of the semiconductor chip 6, the semiconductor chip 6 is similar to the one shown in FIGS. 1 to 4, and the electrode pads 7 and connection pads 23 are connected by the plurality of bonding wires 8. The plurality of connection pads 23 may be arranged in three or more lines along the chip sides 6a. In FIG. 11, the semiconductor device 20 has the connection pads 23 which are disposed in an arc-shape in plane view.

While the invention devised by the inventors has been explained based on embodiments, the invention is not limited to the embodiments described above, and can of course be modified in various ways without departing from its principle points. The foregoing example describes a rectangular, for example square, wiring board and/or a rectangular, for example square, semiconductor chip. However, the invention can also be applied in a wiring board that has four outer peripheral sides joined by four corners and/or a semiconductor chip that has four chip sides joined by four chip corners. The wiring board that has four outer peripheral sides joined by four corners is, for example, parallelogram one or trapezoid one or diamond one etc in plane view. The semiconductor chip that has four chip sides joined by four chip corners can also be, for example, parallelogram one or trapezoid one or diamond one etc in plane view.

Moreover, while the semiconductor device 1 is configured to comprise a plurality of connection pads 3, 23, a plurality of bumps 5, and a plurality of internal wirings 10, these parts are not necessary components for realizing the invention.

Package TC performance can be enhanced by misaligning the corner bumps and the corners of the semiconductor chip, and the reliability of a semiconductor device that incorporates the semiconductor chip can be increased. By tilting the semiconductor chip when disposing it, the wire area and chip mount area can be effectively utilized, making it possible to handle multi-wire products. Effective utilization of these areas enables the wiring board to be made smaller, enabling the semiconductor device itself to be made smaller.

It is apparent that the present invention is not limited to the above embodiments, but may be modified and changed without departing from the scope and spirit of the invention.

What is claimed is:

1. A semiconductor device, comprising:
a wiring board that has four sides joined by four corners;
a semiconductor chip that has four chip sides joined by four chip corners, and is disposed on one face of the wiring board; and
a plurality of connection pads formed on the one face of the wiring board, and that are electrically connected to the semiconductor chip,
wherein the semiconductor chip is disposed such that the four chip sides face the corners of the wiring board, and each chip corner of the semiconductor chip is near a respective one of the sides of the wiring board, and
on one face of the wiring board, the wiring board has each corner region being defined by the chip sides that face the each corner and the sides of the wiring board that form the same corner, and the connection pads are disposed in the corner regions.

2. The semiconductor device according to claim 1, further comprising;
a plurality of bumps arranged in a matrix on another face of the wiring board; and
internal wirings that are formed on the wiring board, the internal wirings connecting the bumps to the connection pad.

3. The semiconductor device according to claim 1, wherein on one face of the semiconductor chip, a plurality of the electrode pads are arranged along the chip sides, and the plurality of connection pads in the corner regions are lined up along the chip sides of the semiconductor chip while curving to the corner sides of the wiring board, and the plurality of bonding wires that join the electrode pads and the connection pads are wired such as to spread mutually in a fan-shape from the electrode pads toward the connection pads.

4. The semiconductor device according to claim 1, wherein on one face of the semiconductor chip, a plurality of the electrode pads are arranged along the chip sides, and the plurality of connection pads in the corner regions are arranged in a plurality of lines along the chip sides of the semiconductor chip while the plurality of connection pads are curving to the corner sides of the wiring board.

5. The semiconductor device according to claim 3, wherein the connection pads are disposed in an arc-shape in plane view.

6. The semiconductor device according to claim 4, wherein the connection pads are disposed in an arc-shape in plane view.

7. The semiconductor device according to claim 1, wherein the one face of the wiring board is laminated with a sealing resin that seals the semiconductor chip, the corner regions, and the bonding wires.

8. The semiconductor device according to claim 4, wherein the plurality of connection pads in the corner regions are arranged in two lines along the chip sides of the semiconductor chip.

9. The semiconductor device according to claim 1, wherein the wiring board is square and the semiconductor chip is square.

10. The semiconductor device according to claim 1, wherein the wiring board is square and the semiconductor chip is square.

11. A method of manufacturing a semiconductor device, the method comprising:
   preparing a wiring board that has four sides joined by four corners and has connection pads being disposed on one face of the wiring board near the corners, wherein the wiring board has a plurality of lands in a matrix-shape disposed on another face of the wiring board electrically connected to the connection pads;
   mounting, on the wiring board, a semiconductor chip that has four chip sides joined by four corners on one face of the wiring board, such that the four chip sides face corners of the wiring board and the chip corners are near the sides of the wiring board;
   connecting electrode pads of the semiconductor chip and the connection pads of the wiring board by bonding wires; and
   disposing a plurality of bumps on the lands in a matrix-shape on another face of the wiring board.

12. The method of manufacturing a semiconductor device according to claim 11, wherein the prepared wiring board is rectangular in plane view, and the mounted semiconductor chip is rectangular in plane view.

13. The method of manufacturing a semiconductor device according to claim 12, wherein the plurality of connection pads are arranged along mount positions of the chip sides of the semiconductor chip, while curving to the corners of the wiring board, the plurality of electrode pads are arranged along the chip sides on one face of the semiconductor chip, and in connecting the electrode pads and the connection pads with the plurality of bonding wires, the plurality of bonding wires are disposed such as to spread mutually in a fan-shape from the electrode pads toward the connection pads.

14. The method of manufacturing a semiconductor device according to claim 12, wherein the plurality of connection pads are arranged in a plurality of lines along mount positions of the chip sides of the semiconductor chip while curving to the corners of the wiring board, the plurality of electrode pads are arranged along the chip sides on one face of the semiconductor chip, and the electrode pads and the connection pads are connected by a plurality of the bonding wires.

15. The method of manufacturing a semiconductor device according to claim 12, further comprising laminating a sealing resin to seal the semiconductor chip and the bonding wires on the one face of the wiring board after connecting the electrode pads and the connection pads and before disposing the plurality of bumps.

16. The method of manufacturing a semiconductor device according to claim 14, wherein the plurality of connection pads are arranged in two lines along mount positions of the chip sides of the semiconductor chip.

17. A semiconductor device, comprising:
   a wiring board including an upper surface and a lower surface opposed to the upper surface;
   a semiconductor chip that is a rectangular shape in plane view, and that includes four sides joined by four chip corners, and that is mounted over the upper surface of the wiring board; and
   a plurality of bumps arranged in a matrix provided on the lower surface of the wiring board, and that are electrically connected to the semiconductor chip,
   wherein the plurality of bumps includes outer bumps that are positioned outermost of the bumps arranging in the matrix, and
   wherein at least one of the four chip corners of the semiconductor chip is positioned outside the outer bumps, by being turned relative to the wiring board.

18. The semiconductor device according to claim 17, wherein the plurality of bumps includes four corner bumps that are positioned at four corners of the bumps arranged in the matrix, and wherein the four corner bumps are deviated from the four chip corners of the semiconductor chip.

19. The semiconductor device according to claim 17, further comprising:
   a plurality of connection pads provided on the upper surface of the wiring board so as to be exposed from the semiconductor chip,
   wherein the connection pads are electrically connecting the semiconductor chip through a wire.

20. The semiconductor device according to claim 17, wherein the at least one of the four chip corners of the semiconductor chip is positioned outside a bump of the outer bumps that is arranged nearest to the at least one of the four chip corners.

* * * * *